(12) United States Patent
Davis, Jr. et al.

(10) Patent No.: US 9,347,984 B2
(45) Date of Patent: May 24, 2016

(54) METHOD TO IMPROVE STRAIN RATE CONTROL OF SMALL LEAD FREE PRINTED CIRCUIT BOARD ASSEMBLY DURING IN CIRCUIT TEST PROCESS

(71) Applicant: LENOVO ENTERPRISE SOLUTIONS (SINGAPORE) PTE. LTD., New Tech Park (SG)

(72) Inventors: Willie T Davis, Jr., Raleigh, NC (US); Larry G Pymento, Cary, NC (US); Derek Robertson, Durham, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 185 days.

(21) Appl. No.: 14/341,417

(22) Filed: Jul. 25, 2014

(65) Prior Publication Data

US 2016/0025804 A1    Jan. 28, 2016

(51) Int. Cl.
*G01R 31/00* (2006.01)
*G01R 31/28* (2006.01)

(52) U.S. Cl.
CPC ........ *G01R 31/2818* (2013.01); *G01R 31/2808* (2013.01)

(58) Field of Classification Search
CPC ........... G01R 31/2801; G01R 31/2808; G01R 31/2818; G01R 31/2886; G01R 31/2889; G01R 31/2891; G01R 1/07371
USPC .............. 324/750.19, 750.2, 750.29, 754.13, 324/754.15, 756.01–756.07, 757.01–757.05
See application file for complete search history.

(56) References Cited

U.S. PATENT DOCUMENTS

| 6,612,022 B1 | 9/2003 | Gale et al. |
| 2005/0261854 A1* | 11/2005 | Adams ............... G01R 31/2808 702/108 |

* cited by examiner

*Primary Examiner* — Arleen M. Vasquez
*Assistant Examiner* — Steven Yeninas
(74) *Attorney, Agent, or Firm* — Kunzler Law Group; Katherine Brown

(57) ABSTRACT

An apparatus includes a top plate and an extension card surrounding a space for a small electronic assembly. The extension card and small electronic assembly are mounted to the top plate. The apparatus includes a plurality of test probes extending through the top plate and moving relative to the top plate. A portion of the test probes are positioned to contact the extension card and a portion are positioned to contact the small electronic assembly when the test probes move with respect to the top plate. The apparatus includes a vacuum box in contact with the top plate and surrounding the extension card and small electronic assembly. The top plate moves relative to the test probes so the test probes contact the extension card and the small electronic assembly in response to a vacuum force evacuating an area under the top plate and within the vacuum box.

20 Claims, 5 Drawing Sheets

METHOD TO IMPROVE STRAIN RATE CONTROL OF SMALL LEAD FREE PRINTED CIRCUIT BOARD ASSEMBLY DURING IN CIRCUIT TEST PROCESS

FIELD

The subject matter disclosed herein relates to electronic assembly testing and more particularly relates to a system for small electronic assembly testing.

BACKGROUND

An In Circuit Test ("ICT") is a method for performing electrical test of Printed Circuit Board Assemblies ("PCBA"), which may also be called electronic assemblies. Typically an electrical test is run using a test fixture with test probes. In some examples, the test probes are spring loaded test probes to make contact with test points on the PCBA. One type of ICT fixture is a vacuum fixture where a vacuum pump is used to close the fixture and move the PCBA into contact with the test probes to enable electrical testing. The process of moving the PCBA in contact with the test probes is often referred to as fixture actuation. When small Printed Circuit Board Assemblies are tested in a vacuum fixture, there is often a relatively small number of test probes and the damping effect of spring loaded probes may be insufficient to prevent the fixture from closing very quickly and the resulting change in loading can occur very quickly which can result in the PCBA being exposed to a high strain rate. Solder joints of PCBA assemblies and especially Lead Free PCBA assemblies are susceptible to solder joint failures when strain rates are excessive. A common practice is to define a limit for the strain rate which a PCBA can experience to reduce a probability of damage.

FIG. 7 depicts test results for a prior art electronic assembly test system showing strain rate and a strain rate limit. Strain gauge rosettes are devices placed on a PCBA to measure strain and often take the form of three stain gauges positioned to measure strain in multiple dimensions. One orientation is to have one strain gauge at 0 degrees, one at 45 degrees and one at 90 degrees. The test results of FIG. 7 are for two rosette locations on a PCBA. The PCBA is a relatively small PCBA. The vertical axis is strain, which is a dimensionless unit and represented with an "e." The units for the vertical axis are µe or micro-e. The horizontal axis depicts strain rate in µe/s or micro-e per second. An end user will usually define a set of safe design limits where the maximum strain and strain rates are identified such that damage due to strain or strain rate is typically prevented. FIG. 7 shows an example of safe limits.

During fixture actuation, the PCBA flexes and may cause damage, including damage to solder joints. The points on the test results show measurements from two rosettes. Measurements were made at a particular sample rate during fixture actuation and release and the data points depict the measurements at the rosette 2 location and the rosette 3 location. In the test results depicted in FIG. 7, strain is recorded at a sample rate of about 1 kilo hertz and the strain rate is calculated from the sample data. Max and min principal strains are calculated from the three strain gauges in a rosette and provide two values which are acting perpendicular to each other along principal axes.

Typically, a certain amount of vacuum pressure is required to ensure that the vacuum seals in an ICT fixture are compressed properly so that reducing the vacuum pressure beyond a certain point to slow down the fixture actuation is impractical. Note that for rosette 2, that there are measurements close to the design limit, and that for rosette 3, both for the min and max tests, there are data points that exceed the design limit. If the strain rate limit is exceeded, there is a risk that the stress applied to the solder joints may weaken the solder joint or printed circuit board laminate integrity, causing time zero failure, or worst case, intermittent failures that will eventually fail in product use (field fail). Lead free formulations, because of the stiffer nature of the reflowed solder composition, tend to be more susceptible to failure modes (cracks, solder fatigue). Typical solutions for a small PCBA condition may involve using bumper guards or dampening devices. However, when the electronic assembly area size is relatively small, these additional measures are typically not enough.

BRIEF SUMMARY

A test apparatus for testing an electronic assembly is disclosed. A system and method also perform the functions of the method. The test apparatus, in one embodiment, includes a top plate and an extension card located within an area of the top plate adjacent to a space of the top plate for a small electronic assembly. The extension card and small electronic assembly are mounted to the top plate wherein the extension card and small electronic assembly are mounted a fixed distance from the top plate. The apparatus, in one embodiment, includes a plurality of test probes extending through openings in the top plate, where the test probes move relative to the top plate and where a portion of the test probes are positioned to contact the extension card and a portion of the test probes are positioned to contact the small electronic assembly when the test probes move with respect to the top plate. The apparatus, in one embodiment, includes a vacuum box in contact with the top plate and surrounding the extension card and small electronic assembly. The top plate, in one embodiment, moves in relation to the test probes a distance sufficient for the test probes to contact the extension card and the small electronic assembly in response to a vacuum force evacuating an area under the top plate and within the vacuum box.

In one embodiment, the vacuum box and top plate are sized for a full size electronic assembly where the full size electronic assembly is larger than the small electronic assembly. In a related embodiment, an outer measurement of the extension card is substantially similar to the full size electronic assembly. In another embodiment, the apparatus includes one or more push-down extensions connected to the vacuum box and sized to contact the small electronic assembly and/or the extension card in response to the vacuum force moving the vacuum box toward the top plate. In a further embodiment, at least one of the push-down extensions are positioned to contact the small electronic assembly in an area on the electronic assembly without one or more of circuit traces and electronic devices.

In one embodiment, the test probes positioned to contact the small electronic assembly are positioned to provide a circuit connection to the small electronic assembly for testing. In another embodiment, the test probes include a spring force that opposes the vacuum force that moves the top plate with respect to the test probes. In another embodiment, a size of the extension card and a number of test probes positioned to contact the extension card are selected to reduce a strain rate associated with the test probes positioned to contact the small electronic assembly contacting the small electronic assembly when the top plate moves in relation to the test probes.

In one embodiment, the extension card is sized with a gap between the small electronic assembly and the extension card. In another embodiment, the extension card and the small electronic assembly are connected to the top plate using a plurality of rigid standoffs sized to maintain the extension card and small electronic assembly separated by the fixed distance. In another embodiment, the apparatus includes one or more top test probes connected to the vacuum box where when the vacuum force moves the vacuum box toward the top plate, the top test probes contact the small electronic assembly. In another embodiment, the apparatus includes one or more resilient vacuum seals positioned between the top plate and the vacuum box and between the top plate and a fixed bottom plate where the vacuum seals maintain the vacuum box a distance away from the top plate and the top plate a distance away from the bottom plate when the vacuum force is not applied, and where the vacuum seals compress when the vacuum force is applied allowing the vacuum box to move toward the top plate and allowing the test probes to move relative to the top plate and to contact the extension card and the small electronic assembly.

A testing method includes, in one embodiment, mounting a small electronic assembly and an extension card to a top plate. The extension card is located within an area of the top plate adjacent to a space of the top plate for a small electronic assembly. The extension card and small electronic assembly are mounted to the top plate a fixed distance from the top plate. The method, in one embodiment, includes positioning a plurality of test probes to extend through openings in the top plate, where the test probes move relative to the top plate and where a portion of the test probes are positioned to contact the extension card and a portion of the test probes are positioned to contact the small electronic assembly when the test probes move with respect to the top plate. The test method, in one embodiment, includes positioning a vacuum box to contact with the top plate. The vacuum box surrounds the extension card and small electronic assembly. The test method, in one embodiment, includes providing a vacuum force to an area under the top plate and within the vacuum box, where the top plate moves in relation to the test probes a distance sufficient for the test probes to engage the extension card and the small electronic assembly in response to the vacuum force.

In one embodiment, the vacuum force moves the vacuum box toward the top plate and the vacuum box connects to one or more push-down extensions. The push-down extensions are sized to contact the small electronic assembly and/or the extension card in response to the vacuum force moving the vacuum box toward the top plate. In another embodiment, the method includes electronically testing the small electronic assembly while one or more of the test probes are in contact with the small electronic assembly. In another embodiment, the method includes reversing the vacuum force in response to completion of the testing, where reversing the vacuum force causes the top plate to move relative to the test probes such that the test probes move away from the extension card and small electronic assembly and such that the vacuum box moves away from the top plate. In another embodiment, the test probes include a spring force that opposes the vacuum force that moves the top plate with respect to the test probes.

A system for testing includes a top plate and an extension card located within an area of the top plate adjacent to a space of the top plate for a small electronic assembly. The extension card and small electronic assembly are mounted to the top plate where the extension card and small electronic assembly are mounted a fixed distance from the top plate. The system, in one embodiment, includes a plurality of test probes extending through openings in the top plate, where the test probes move relative to the top plate and where a portion of the test probes are positioned to contact the extension card and a portion of the test probes are positioned to contact the small electronic assembly when the test probes move with respect to the top plate. The system, in one embodiment, includes a vacuum box in contact with the top plate and surrounding the extension card and small electronic assembly. The system, in another embodiment, includes one or more push-down extensions connected to the vacuum box and sized to contact one or more of the small electronic assembly and the extension card in response to the vacuum box moving toward the top plate. The system, in one embodiment, includes a vacuum that applies a vacuum force, where the top plate moves in relation to the test probes a distance sufficient for the test probes to contact the extension card and the small electronic assembly in response to the vacuum force evacuating an area under the top plate and within the vacuum box.

In one embodiment, the system includes an electronic testing assembly that applies an electronic test to the small electronic assembly in response to one or more test probes contacting the small electronic assembly. In another embodiment, the system includes one or more top test probes connected to the vacuum box that contact the small electronic circuit in response to the vacuum box moving toward the top plate.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION OF THE INVENTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

The schematic flowchart diagrams and/or schematic block diagrams in the Figures illustrate the architecture, functionality, and operation of possible implementations. It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Although various arrow types and line types may be employed in the flowchart and/or block diagrams, they are understood not to limit the scope of the corresponding embodiments. Indeed, some arrows or other connectors may be used to indicate only an exemplary logical flow of the depicted embodiment.

The description of elements in each figure may refer to elements of proceeding figures. Like numbers refer to like elements in all figures, including alternate embodiments of like elements.

Figure 1A:
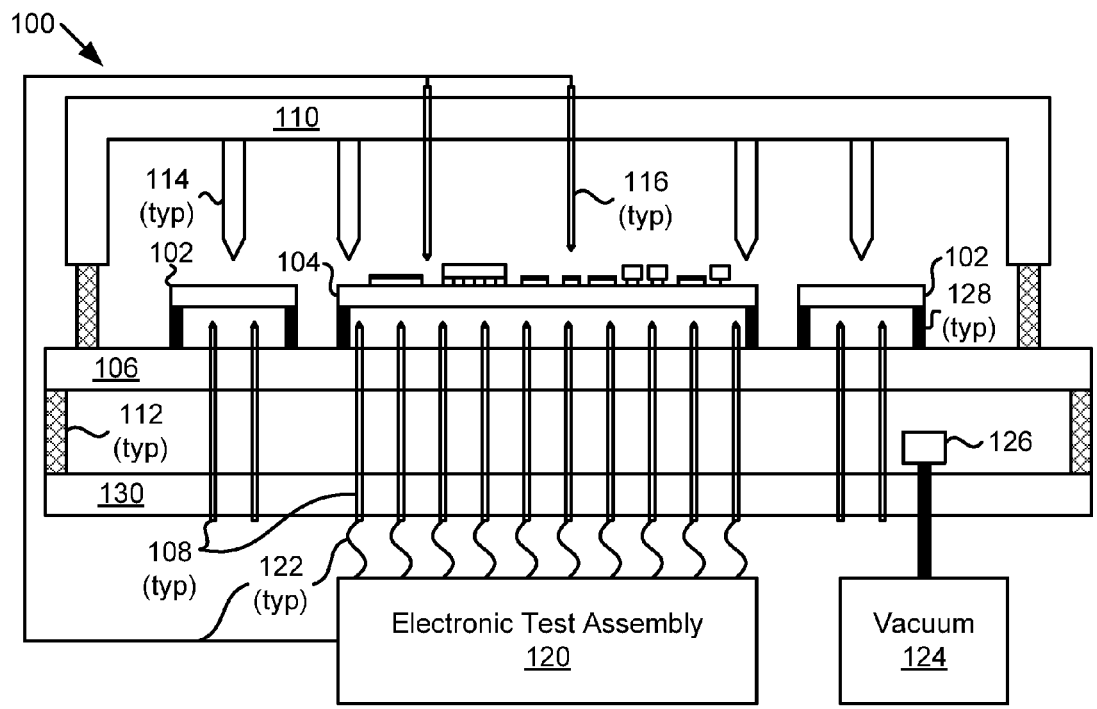
FIG. 1A is a schematic block diagram illustrating a section view of one embodiment of a system for testing an electronic assembly, shown in a first position, in accordance with one embodiment of the present invention.
Figure 1B:
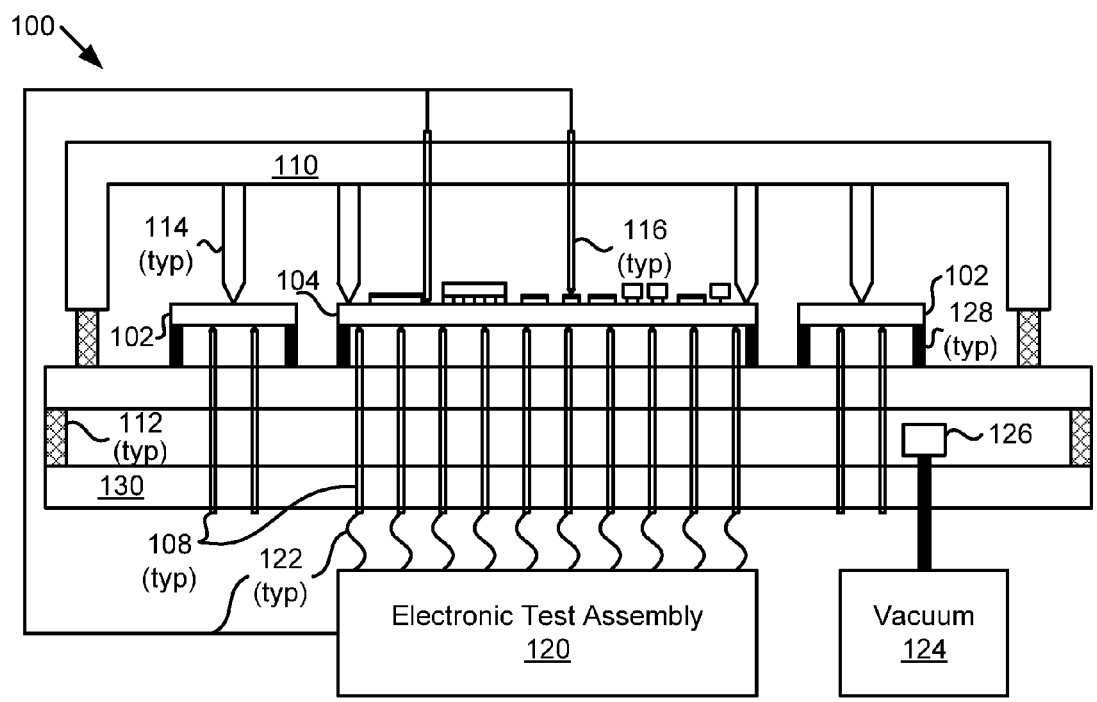
FIG. 1B is a schematic block diagram illustrating a section view of one embodiment of a system for testing an electronic assembly, shown in a second position, in accordance with one embodiment of the present invention.

FIG. 1A is a schematic block diagram illustrating a section view of one embodiment of a system 100 for testing an electronic assembly, shown in a first position, in accordance with one embodiment of the present invention. FIG. 1B is the same system 100 in a second position. The first position is indicative of when a vacuum force is not present and the second position is indicative of when a vacuum force is present and vacuum seals 112 are compressed. The system 100 includes an extension card 102, a space for a small electronic assembly 104, a top plate 106, a test probes 108, a vacuum box 110, vacuum seals 112, push-down extensions 114, top test probes 116, an electronic test assembly 120, conductors 122, a vacuum 124 connected to a vacuum port 126, standoffs 128, and bottom plate 130, which are described below. The small electronic assembly 104, in one embodiment, is not included in the system 100, but the system 100 may be designed for a small electronic assembly 104 in general or for a specific small electronic assembly 104.

Figure 2:
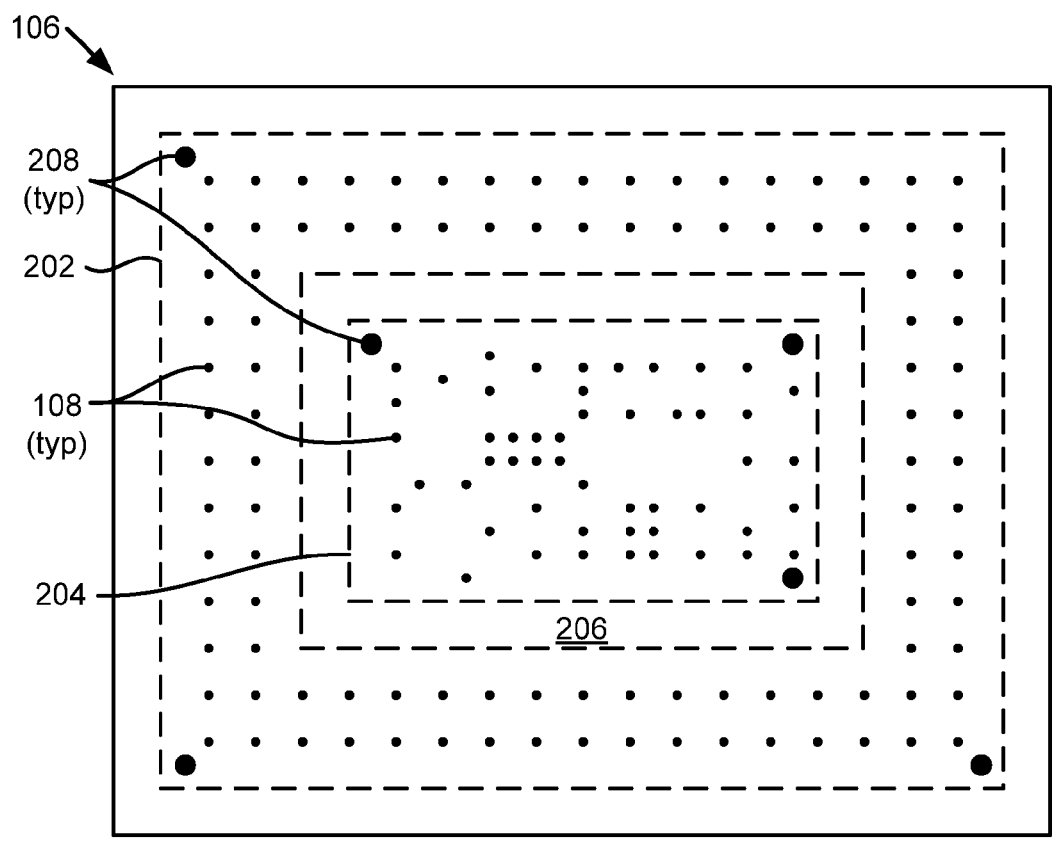
FIG. 2 is a schematic block diagram illustrating a plan view of one embodiment of a top plate for testing an electronic assembly, in accordance with one embodiment of the present invention.
Figure 3:
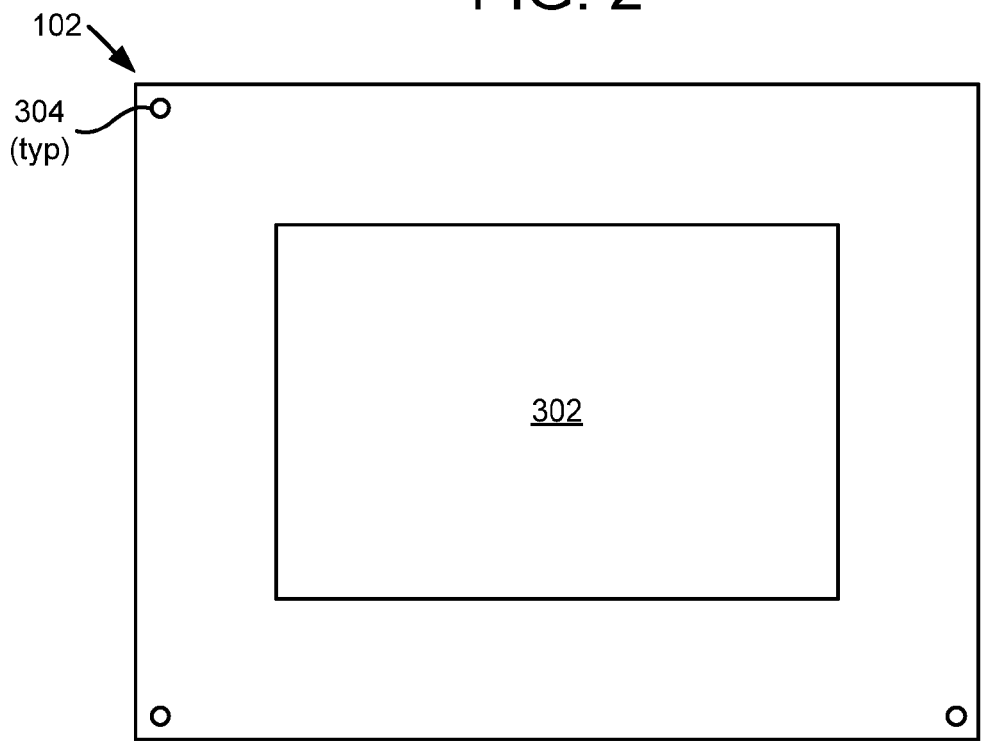
FIG. 3 is a schematic block diagram illustrating a plan view of one embodiment of an extension card for testing an electronic assembly, in accordance with one embodiment of the present invention.
Figure 4:
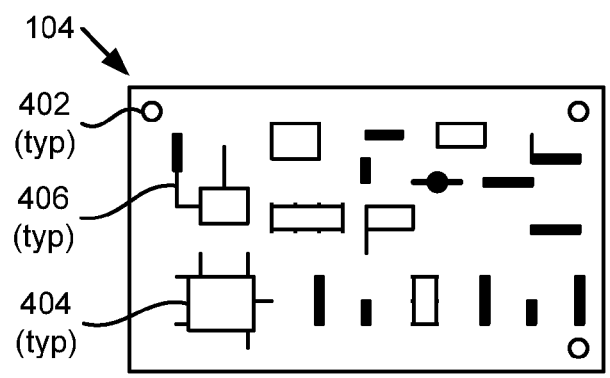
FIG. 4 is a schematic block diagram illustrating a plan view of one embodiment of a small electronic assembly for testing an electronic assembly, in accordance with one embodiment of the present invention.

The system 100, in one embodiment, includes a top plate 106, which may be for an ICT fixture. The system 100 includes an extension card 102 that is located within an area of a top plate 106 adjacent to a space of the top plate 106 for the small electronic assembly 104. The extension card 102 and small electronic assembly 104 are mounted to the top plate 106. FIG. 2 is a plan view of the top plate 106. FIG. 2 depicts an outline 202 of where the extension card 102 is mounted to the top plate 106 and an outline 204 of where the small electronic assembly 104 is mounted to the top plate 106. FIG. 3 is a plan view of the extension card 102, and FIG. 4 is a plan view of the small electronic assembly 104.

The small electronic assembly 104 as used herein is an electronic assembly that is smaller than the top plate 106 and is small enough that fixture actuation may, without an extension card 102, cause strain or strain rate to exceed design limits. Addition of an extension card 102 and test probes 108 under the extension card 102 adds a mechanical load so that, during fixture actuation, strain rate, and possibly strain, on the small electronic assembly 104 are reduced and are typically within design limits. The small electronic assembly 104 may be any size relative to the top plate 106 where the size of the small electronic assembly 104 may cause strain rates beyond the design limits. An electronic assembly is typically a printed circuit board assembly ("PCBA") with electronic components mounted on the printed circuit board ("PCB"). Typically the PCBA includes circuit traces between the electronic components and the PCBA is designed for a particular purpose and typically includes input and output connections. Often the electronic components are soldered to the PCB and the solder joints may be lead-free solder joints.

In one embodiment, the small electronic assembly 104 is in a production state where testing is useful. The system 100 typically tests the small electronic assembly 104 through test probes 108, and possibly through top test probes 116, which are positioned to contact particular points and electronic devices on the small electronic assembly 104. For example, the small electronic assembly 104 may be in a final production state and testing is useful to verify proper operation of the small electronic assembly 104. The system 100 may be designed for testing of electronic assemblies that are large enough where an extension card 102 is not used as well as for small electronic assemblies 104 where an extension card 102 is used.

Typically, the extension card 102 surrounds the small electronic assembly 104. In the depicted embodiment, the small electronic assembly 104 is centered within an opening within the extension card 102. In other embodiments (not shown), the extension card 102 is adjacent to the small electronic assembly 104 where the small electronic assembly 104 is not centered and also when the small electronic assembly 104 is positioned at to a side or corner of the top plate 106 where the extension card 102 is adjacent to two or three sides of the small electronic assembly 104. In one embodiment, the small electronic assembly 104 may be positioned anywhere on the top plate 106 and the extension card 102 is shaped to take up an appropriate portion of the top plate 106 not covered by the small electronic assembly 104. A gap may exist between the extension card 102 and the small electronic assembly 104.

FIGS. 1A, 1B and 2 depict test probes 108 in relation to the top plate 106. Typically, test probes 108 extend through the top plate 106. A portion of the test probes 108 are strategically positioned under the small electronic assembly 104 to contact traces and electronic components of the small electronic assembly 104 for testing. In addition, a portion of the test probes 108 are positioned under the extension card 102 to provide a mechanical load to oppose a vacuum force and to slow fixture actuation so that strain rates on the small electronic assembly 104 are below design limits.

In one embodiment, the test probes 108 move in relation to the top plate 106 to contact the small electronic assembly 104 and extension card 102. For example, during fixture actuation, the small electronic assembly 104 and extension card 102 may be mounted to the top plate and the top plate 106 may move in a direction toward the test probes 108 so the small electronic assembly 104 and extension card 102 also move toward the test probes 108. In the embodiment, the test probes 108 may be fixed so that the small electronic assembly 104 and extension card 102 move toward the test probes 108. In another embodiment, fixture actuation may cause the test probes 108 to move toward the small electronic assembly 104 and extension card 102, for example if the top plate 106 is fixed and a bottom plate 130 with test probes 108 moves during fixture actuation.

In another embodiment, the test probes 108 include some type of spring or other damping mechanism. While the upward-directed force of the test probes 108 cause strain and strain rate on the small electronic assembly 104 when the test probes 108 engage the small electronic assembly 104 and extension card 102, test probes 108 with some type of spring or dampening may move in such a way as to reduce strain and strain rate on the small electronic assembly 104 when compared with rigid test probes. For example, the test probes 108 may be spring loaded. The small electronic assembly 104 and extension card 102 may be rigidly mounted to the top plate 106 so that the small electronic assembly 104 and extension card 102 move with the top plate 106. Spring-loaded test probes 108 may also function to contact the small electronic assembly 104 where there are some irregularities or deflection associated with the small electronic assembly 104.

In the depicted example, standoffs 128 are positioned between the small electronic assembly 104 and top plate 106 and the extension card 102 and the top plate 106. One example of a spring loaded test probe 108 includes a spring within a hollow tube where the spring is attached to a rod that fits in the hollow tube. Typically there is electrical continuity between an exposed end of the rod, through the spring and to a base or connector on the hollow tube.

In another embodiment, the test probes are made of a resilient material and are shaped to bend and provide a spring force when contacting the small electronic assembly 104 or extension card 102. One of skill in the art will recognize other ways to construct a test probe 108 that has a spring force and moves when contacting the small electronic assembly 104 or extension card 102. In another example, the test probes 108 are rigid and the small electronic assembly 104 and extension card 102 are mounted to the top plate 106 using springs or other dampening devices such that the small electronic assembly 104 and extension card 102 move relative to the top plate 106 in response to the test probes 108 engaging the small electronic assembly 104 and extension card 102. In another embodiment, the test probes 108 are rigid and the extension card 102 and small electronic assembly 104 are also rigidly mounted to the top plate 106.

In one embodiment, the system 100 includes a vacuum box 110 that contacts the top plate 106 and, in one example, surrounds the extension card 102 and small electronic assembly 104. Typically, the vacuum box 110 is designed to allow a vacuum to form under the vacuum box 110 when a vacuum force is applied. The vacuum force is typically applied by evacuating air or other gas from the vacuum box 110 and an area under the top plate 106. For example, gaps around the test probes 108 or other holes or gaps in the top plate 106 allow air or other gas to be evacuated from the area under the top plate 106. In the example depicted in FIGS. 1A and 1B, the top plate 106, a bottom plate 130 positioned below the top plate 106, and vacuum seals 112 on the ends of the top plate 106 and bottom plate 130 form a chamber and air or other gas may be evacuated from the chamber. In addition, air or other gas is evacuated from the vacuum box 110.

Typically, the vacuum box 110 and top plate 106 are sized for a "full size" electronic assembly or PCBA, where the full size electronic assembly/PCBA is larger than the small electronic assembly 104. In one example, a full size electronic assembly may occupy much of the space available on the top plate 106 and/or under the vacuum box 110. In one example, an outer measurement of the extension card 102 is substantially similar to the full size electronic assembly. A full size electronic assembly or PCBA, in one embodiment, is an electronic assembly for which the top plate 106 and vacuum box 110 are designed. One of skill in the art will recognize that a full size electronic assembly will vary based on varying sizes of top plates 106 and vacuum boxes 110. For a particular top plate 106 and vacuum box 110, the small electronic assembly 104 is smaller than an electronic assembly (e.g. full size electronic assembly) for which the top plate 106 and vacuum box 110 are designed to handle. In one embodiment, the small electronic assembly 104 is small enough that fixture actuation of the small electronic assembly 104 without an extension card 102 and corresponding test probes 108 under the extension card 102 may cause excessive strain and/or strain rate on the small electronic assembly 104.

In one example, vacuum seals 112 are positioned between the bottom of the vacuum box 110 and thus effect contact between the top plate 106 and vacuum box 110. In another embodiment, the vacuum seals 112 between the vacuum box 110 and top plate 106 and between the top plate 106 and bottom plate 130 compress during fixture actuation when the vacuum force is applied and air or other gas is evacuated from the vacuum box 110 and area under the top plate 106. Compression of the vacuum seals 112, in one embodiment, cause the test probes 108 to move relative to the top plate 106 so that the test probes 108 contact the small electronic assembly 104 and extension card 102 and cause the vacuum box 110 to move toward the top plate 106, small electronic assembly 104 and extension card 102.

In a prior art example, if a test assembly did not include the extension card 102, fewer test probes 108 would contact the small electronic assembly 104 to oppose the vacuum force and movement of the test probes toward the small electronic assembly 104, which may cause excessive strain rates on the small electronic assembly 104. Various testing assemblies are typically designed to test electronic assemblies of a certain size so testing of a small electronic assembly 104 may cause excessive strain rates on the small electronic assembly 104 because a smaller electronic assembly may have less test probes 108 to absorb impact due to movement of the test probes 108 toward the small electronic assembly 104.

In the system 100 depicted, with the addition of an extension card 102 and additional test probes 108 under the extension card 102, the additional test probes 108 oppose the vacuum force and slow fixture actuation so that strain rates on the small electronic assembly 104 are typically within design limits. For example, the small electronic assembly 104 in combination with the extension card 102 and the test probes 108 below the extension card 102 more closely approximate an electronic assembly for which a vacuum test assembly is designed. Addition of the extension card 102 and test probes 108 under the extension card 102, in one embodiment, allow the vacuum test assembly to be used with the small electronic assembly 104 as well as larger electronic assemblies without having to construct a vacuum test assembly specifically designed for a small electronic assembly 104.

In one embodiment, the vacuum box 110 does not need to move during fixture actuation and the vacuum box 110 includes vacuum seals 112 that do not compress any particular amount during fixture actuation. In another embodiment, the vacuum box 110 includes vacuum seals 112 that compress a desired amount during fixture actuation. For example, the vacuum box 110 may include push-down extensions 114 designed and positioned to engage the small electronic assembly 104 and/or extension card 102. The push-down extensions 114 may provide additional force on the small electronic assembly 104 and/or extension card 102 to counteract movement of the test probes 108 toward the small electronic assembly 104 and extension card 102. In another embodiment, the vacuum box 110 may include top test probes 116. The top test probes 116 may be sized and positioned to contact certain points on the small electronic assembly 104 for electronic testing.

In one embodiment, a vacuum box 110 without push-down extensions 114 includes vacuum seals 112 configured to compress an amount appropriate for top test probes 116 to engage appropriate points on the small electronic assembly 104. In another embodiment, the vacuum box 110 includes push-down extensions 114 of particular lengths so that top test probes 116 engage contacts on the small electronic assembly 104 a certain amount.

As stated above, FIG. 1A depicts a first position indicative of when the vacuum force is not present. In the first position, the test probes 108, and top test probes 116 are not engaging the small electronic assembly 104. FIG. 1B depicts a second position indicative of when the vacuum force is applied and the vacuum seals 112 are compressed and the test probes 108, and top test probes 116 are engaging the small electronic assembly 104. While a bottom plate 130 is depicted in FIGS. 1A and 1B, the system 100 may not include a bottom plate 130 but may include other parts and pieces located below the top plate 106 shaped and sealed in such a way that a chamber is formed under the top plate 106 so that air or other gas can be evacuated from the chamber as a result of the vacuum force.

In one embodiment, the vacuum force is applied using a vacuum 124 connected to a vacuum port 126 within the chamber under the top plate 106 or in the vacuum box 110. In other embodiments, the system 100 may include multiple vacuum ports 126 conveniently positioned within the chamber under the top plate 106 or in the vacuum box 110 and connected to the vacuum 124. The vacuum 124 may transport air or other gas from the chamber under the top plate 106 and the vacuum box 110. One or more vacuum ports 126 may also be used to transport air or other gas to the chamber under the top plate 106 or the vacuum box 110 when the vacuum force is not present, during a fixture "release."

After fixture actuation, when the test probes 108 and possibly top test probes 116 have engaged the small electronic assembly 104 and extension card 102, an electronic test assembly 120 tests the small electronic assembly 104. The electronic test assembly 120 may connect to the test probes 108, and the top test probes 116 through conductors 122. After testing, typically a fixture release allows air or other gas to enter the chamber under the top plate 106 and the vacuum box 110 so that the test probes 108, and if included, the top test probes 116 disengage the small electronic assembly 104 and extension card 102. Note that the extension card 102 and load from the test probes 108 under the extension card 102 may also prevent excessive strain rates during fixture release.

As mentioned above, FIG. 2 depicts a plan view of the top plate 106, where an outline 202 of where the extension card 102 overlays the top plate 106 is depicted along with an outline 204 of where the small electronic assembly 104 overlays the top plate 106. Note that test probes 108 under the small electronic assembly 104 are in particular locations and the locations typically vary based on the particular small electronic assembly 104 being tested. The test probes 108 under the extension card 102 are depicted in a more regular pattern in FIG. 2. In one embodiment, the number of test probes 108 under the extension card 102 are chosen to approximate a number of test probes 108 that may be expected in the area of the extension card 102 for a larger electronic assembly that may not require an extension card 102 to reduce strain rates to below design limits. The location and regularity of the test probes 108 under the extension card 102 may be chosen for convenience, efficiency, or other relevant design parameter.

Note that there is a gap 206 between the extension card 102 and small electronic assembly 104. The size of the gap 206 may be chosen to facilitate placement of the small electronic assembly 104 to minimize interference from the extension card 102 so that one small electronic assembly 104 can be removed and replaced with another small electronic assembly 104 when testing multiple small electronic assemblies 104. In one embodiment, the top plate 106 includes one or more locating pins 208 that facilitate accurate placement of the small electronic assembly 104 and/or extension card 102. In one embodiment, the top plate 106 includes locating pins 208 for the small electronic assembly 104 but not for the extension card 102. Locating pins 208 for the extension card 102 may not be used since exact placement of the extension card 102 may not be necessary and the extension card 102 may be positioned using less accurate methods.

FIG. 3 is a plan view of one embodiment of the extension card 102. Note that the extension card 102 includes an opening 302 sized so that the small electronic assembly 104 fits in the opening 302. In one embodiment, the extension card 102 includes holes 304 for locating pins 208. FIG. 4 is a plan view of one embodiment of the small electronic assembly 104. In the embodiment depicted in FIG. 4, the small electronic assembly 104 includes holes 402 for locating pins 208 on the top plate 106. Other embodiments may include other mechanisms for accurately locating the small electronic assembly 104 with respect to the top plate 106. For example, the top plate 106 may include pins, planar structures, guides, etc. that fit around the small electronic assembly 104 and/or extension card 102 to accurately locate the small electronic assembly 104 and/or extension card 102 with respect to the top plate 106. One of skill in the art will recognize other ways to accurately place the small electronic assembly 104 and/or extension card 102 with respect to the top plate 106.

The small electronic assembly 104 includes electronic devices 404, such as resistors, capacitors, inductors, diodes, switches, or other IC chips and electronic devices. The small electronic assembly 104 also includes one or more circuit traces 406, as is typical for an electronic assembly. Note that the electronic devices 404 and circuit traces 406 depicted in FIG. 4 as well as the electronic devices depicted on the small electronic assembly 104 in FIGS. 1A and 1B are exemplary and one of skill in the art will recognize that electronic devices 404 and circuit traces 406 will vary significantly between various electronic assemblies being tested. In one embodiment, a top plate 106 is designed specifically for a particular small electronic assembly 104 or larger electronic assembly. In another embodiment, the top plate 106 is designed to be reconfigured for various electronic assemblies. In addition, the extension card 102 may be designed for a specific small electronic assembly 104 or may be designed for a small electronic assembly 104 of a particular shape or range of shapes.

Figure 5:
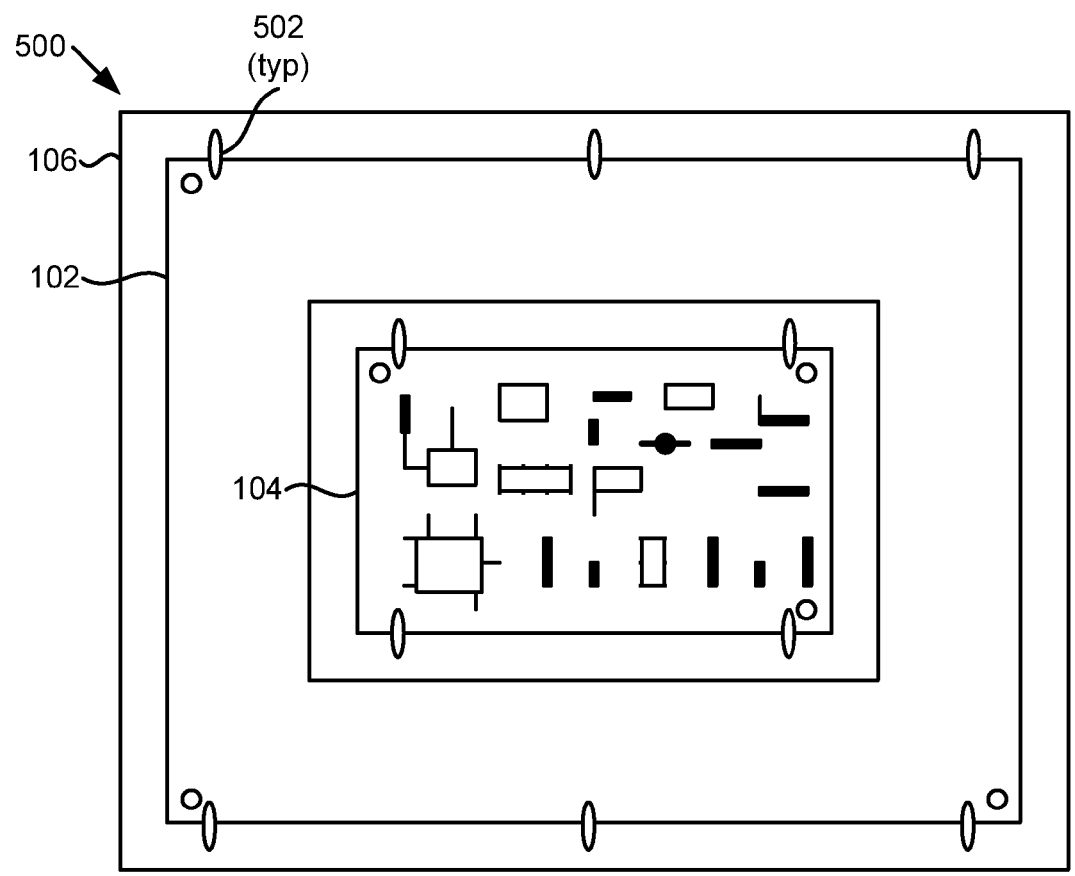
FIG. 5 is a schematic block diagram illustrating a plan view of one embodiment of a top plate with an extension card and a small electronic assembly secured to the top plate, in accordance with one embodiment of the present invention.

FIG. 5 is a schematic block diagram illustrating a plan view of one embodiment 500 of a top plate 106 with an extension card 102 and a small electronic assembly 104 secured to the top plate 106, in accordance with one embodiment of the present invention. The extension card 102 and small electronic assembly 104 are secured to the top plate 106, in the depicted embodiment, using twist-lock clamps 502. For example, the standoffs 128 may provide a fixed distance between the top plate 106 and the small electronic assembly 140 and extension card 102 while the twist-lock clamps 502 or other securing mechanism, such as the push-down extensions 114 may hold the small electronic assembly 140 and extension card 102 in place and against the standoffs 128. Other embodiments may include other means for securing the extension card 102 and small electronic assembly 104 to the top plate 106, including but not limited to screws, clamps, locks, etc. In one embodiment, the locating pins 208 are separate from means to secure the extension card 102 and small electronic assembly 104 to the top plate 106. In other embodiments, the locating pins 208 are part of means to secure the extension card 102 and small electronic assembly 104 to the top plate 106. The locating pins 208, push-down extensions 114, standoffs 128, twist-lock clamps 502, etc. may be used in various combinations to secure the small electronic assembly 104 and/or extension card 102 to the top plate 106 during testing. One of skill in the art will recognize other ways to secure the extension card 102 and small electronic assembly 104 to the top plate 106.

Figure 6:
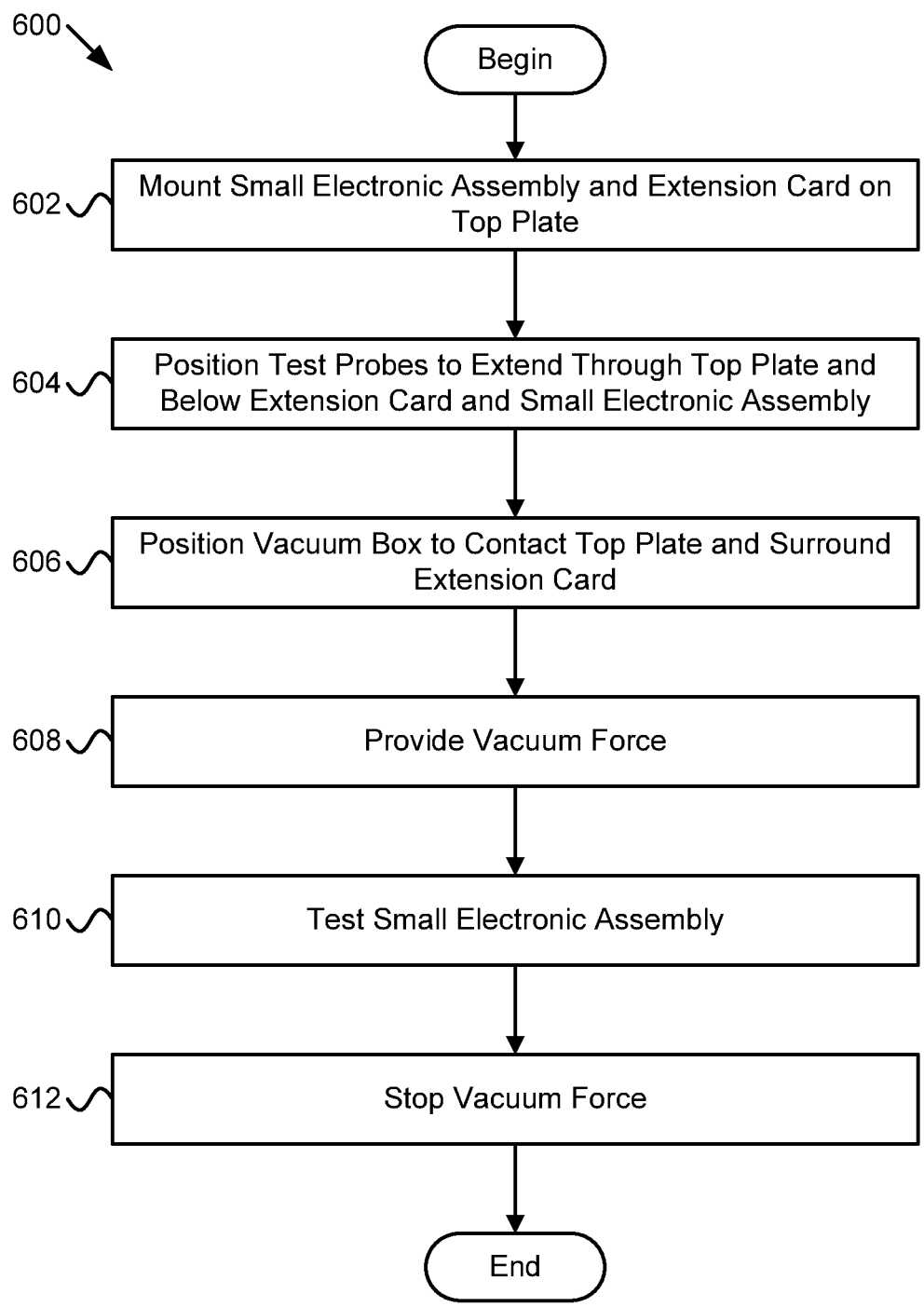
FIG. 6 is a schematic flow chart diagram illustrating one embodiment of a method for testing an electronic assembly in accordance with one embodiment of the present invention.
Figure 7:
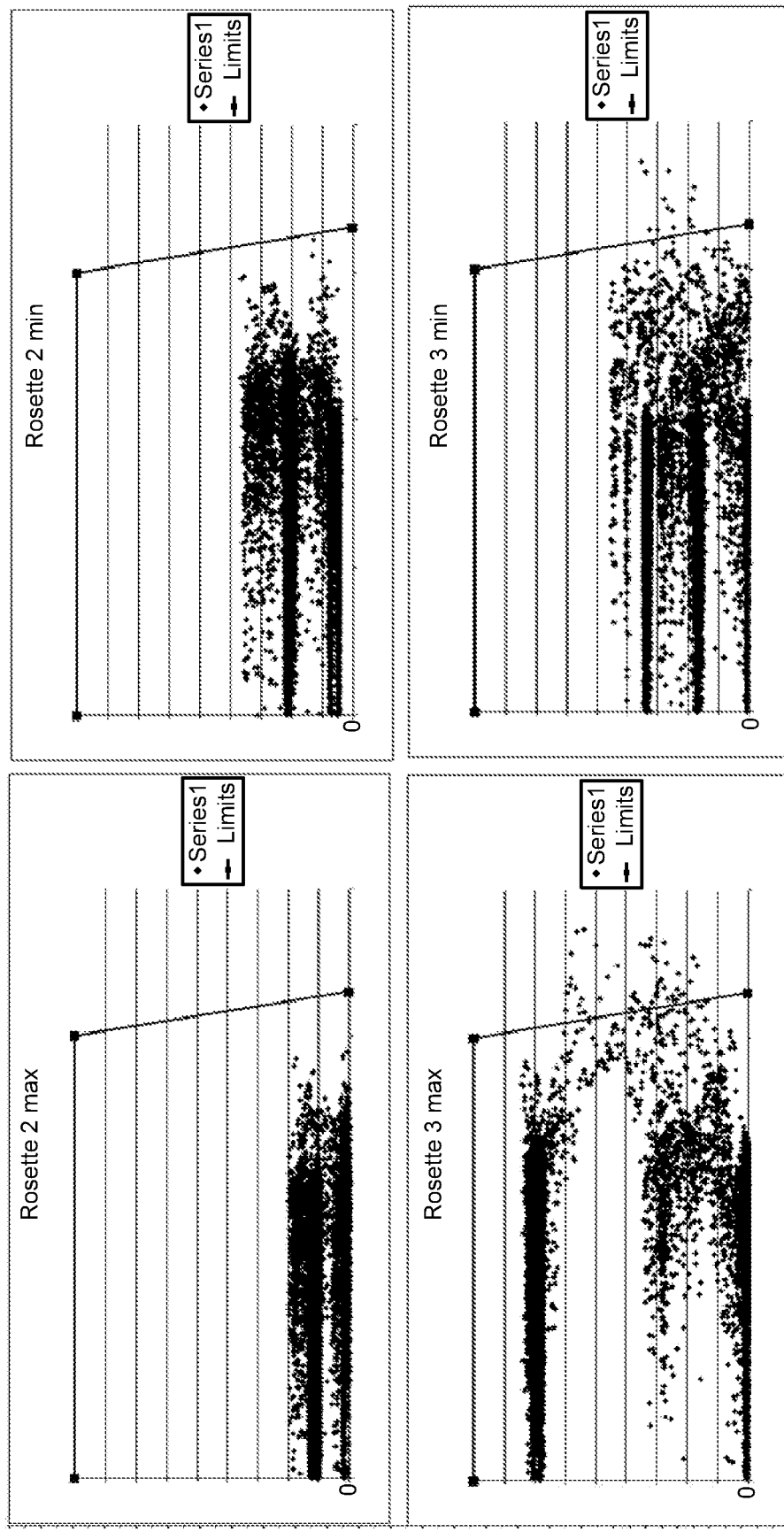
FIG. 7 depicts test results for a prior art electronic assembly test system showing strain rate and a strain rate limit.

FIG. 6 is a schematic flow chart diagram illustrating one embodiment of a method 600 for testing an electronic assembly in accordance with one embodiment of the present invention. The method 600 begins and mounts 602 a small electronic assembly 104 and an extension card 102 to a top plate 106. The extension card 102, in one embodiment, surrounds a space for the small electronic assembly 104. The small electronic assembly 104 may be of a specific design, in one embodiment. In another embodiment, the small electronic assembly 104 is a shape within a range of widths and lengths. The extension card 102 and small electronic assembly 104, in one embodiment, are mounted to the top plate 106 a fixed distance from the top plate 106 using standoffs 128. The fixed distance, in one embodiment is zero. For example, the extension card 102 and small electronic assembly 104 may be mounted directly to the top plate 106 or may also be recessed into the top plate 106. In another embodiment, the fixed distance is greater than zero and may be defined by a size of a standoff 128.

The method 600 positions 604 a plurality of test probes 108 to extend through openings in the top plate 106, where the test probes 108 move relative to the top plate 106 and a portion of the test probes 108 are positioned to contact the extension card 102 and a portion of the test probes 108 are positioned to contact the small electronic assembly 104 when the test probes 108 move with respect to the top plate 106. The method 600 positions 606 a vacuum box 110 to contact with the top plate 106. In one embodiment, the vacuum box 110 surrounds the extension card 102 and small electronic assembly 104. In one embodiment, the vacuum box 110 includes top test probes 116 positioned to engage the top of the small electronic assembly 104 when the vacuum box 110 moves toward the small electronic assembly 104. The method 600 provides 608 a vacuum force to an area under the top plate 106 and within the vacuum box 110, and in one embodiment, the method 600 ends. In one embodiment, the top plate 106 moves in relation to the test probes 108 a distance sufficient for the test probes 108 to engage the extension card 102 and the small electronic assembly 104 in response to the vacuum force.

Optionally, the method 600 tests 610 the small electronic assembly 104, for example using the electronic test assembly 120, and stops 612 the vacuum force so that the test probes 108, and possibly top test probes 116, move away from the small electronic assembly 104 and extension card 102, and the method 600 ends. In one embodiment, the system 100 depicted in FIGS. 1A, 1B, and 2-5 perform the steps of the method 600.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A test apparatus comprising:
a top plate;
an extension card located within an area of the top plate adjacent to a space of the top plate for a small electronic assembly, the extension card and small electronic assembly mounted to the top plate wherein the extension card and small electronic assembly are mounted a fixed distance from the top plate;
a plurality of test probes extending through openings in the top plate, wherein the test probes move relative to the top plate and wherein a portion of the test probes are positioned to contact the extension card and a portion of the test probes are positioned to contact the small electronic assembly when the test probes move with respect to the top plate; and
a vacuum box in contact with the top plate and surrounding the extension card and small electronic assembly,
wherein the top plate moves in relation to the test probes a distance sufficient for the test probes to contact the extension card and the small electronic assembly in response to a vacuum force evacuating an area under the top plate and within the vacuum box.

2. The apparatus of claim 1, wherein the vacuum box and top plate are sized for a full size electronic assembly, wherein the full size electronic assembly is larger than the small electronic assembly.

3. The apparatus of claim 2, wherein an outer measurement of the extension card is substantially similar to the full size electronic assembly.

4. The apparatus of claim 1, further comprising one or more push-down extensions connected to the vacuum box and sized to contact one or more of the small electronic assembly and the extension card in response to the vacuum force moving the vacuum box toward the top plate.

5. The apparatus of claim 4, wherein at least one of the one or more push-down extensions are positioned to contact the small electronic assembly in an area on the electronic assembly without one or more of circuit traces and electronic devices.

6. The apparatus of claim 1, wherein the test probes positioned to contact the small electronic assembly are positioned to provide a circuit connection to the small electronic assembly for testing.

7. The apparatus of claim 1, wherein the test probes comprise a spring force that opposes the vacuum force that moves the top plate with respect to the test probes.

8. The apparatus of claim 1, wherein a size of the extension card and a number of test probes positioned to contact the extension card are selected to reduce a strain rate associated with the test probes positioned to contact the small electronic assembly contacting the small electronic assembly when the top plate moves in relation to the test probes.

9. The apparatus of claim 1, wherein the extension card is sized with a gap between the small electronic assembly and the extension card.

10. The apparatus of claim 1, wherein the extension card and the small electronic assembly are connected to the top plate using a plurality of rigid standoffs sized to maintain the extension card and small electronic assembly separated by the fixed distance.

11. The apparatus of claim 1, further comprising one or more top test probes connected to the vacuum box wherein when the vacuum force moves the vacuum box toward the top plate, the top test probes contact the small electronic assembly.

12. The apparatus of claim 1, further comprising one or more resilient vacuum seals positioned between the top plate and the vacuum box and between the top plate and a fixed bottom plate wherein the vacuum seals maintain the vacuum box a distance away from the top plate and the top plate a distance away from the bottom plate when the vacuum force is not applied and wherein the vacuum seals compress when the vacuum force is applied allowing the vacuum box to move toward the top plate and allowing the test probes to move relative to the top plate and to contact the extension card and the small electronic assembly.

13. A testing method comprising:
mounting a small electronic assembly and an extension card to a top plate, the extension card located within an area of the top plate adjacent to a space of the top plate for a small electronic assembly, the extension card and small electronic assembly mounted to the top plate a fixed distance from the top plate;
positioning a plurality of test probes to extend through openings in the top plate, wherein the test probes move relative to the top plate and wherein a portion of the test probes are positioned to contact the extension card and a portion of the test probes are positioned to contact the small electronic assembly when the test probes move with respect to the top plate;
positioning a vacuum box to contact with the top plate, the vacuum box surrounding the extension card and small electronic assembly; and
providing a vacuum force to an area under the top plate and within the vacuum box, wherein the top plate moves in relation to the test probes a distance sufficient for the test probes to engage the extension card and the small electronic assembly in response to the vacuum force.

14. The method of claim 13, wherein the vacuum force moves the vacuum box toward the top plate and the vacuum box connects to one or more push-down extensions, the push-down extensions sized to contact one or more of the small electronic assembly and the extension card in response to the vacuum force moving the vacuum box toward the top plate.

15. The method of claim 13, further comprising electronically testing the small electronic assembly while one or more of the test probes are in contact with the small electronic assembly.

16. The method of claim 15, further comprising reversing the vacuum force in response to completion of the testing, wherein reversing the vacuum force causes the top plate to move relative to the test probes such that the test probes move away from the extension card and small electronic assembly and such that the vacuum box moves away from the top plate.

17. The method of claim 13, wherein the test probes comprise a spring force that opposes the vacuum force that moves the top plate with respect to the test probes.

18. A system for testing comprising:
a top plate;
an extension card located within an area of the top plate adjacent to a space of the top plate for a small electronic assembly, the extension card and small electronic assembly mounted to the top plate wherein the extension card and small electronic assembly are mounted a fixed distance from the top plate;
a plurality of test probes extending through openings in the top plate, wherein the test probes move relative to the top plate and wherein a portion of the test probes are positioned to contact the extension card and a portion of the test probes are positioned to contact the small electronic assembly when the test probes move with respect to the top plate;
a vacuum box in contact with the top plate and surrounding the extension card and small electronic assembly;
one or more push-down extensions connected to the vacuum box and sized to contact one or more of the small electronic assembly and the extension card in response to the vacuum box moving toward the top plate; and
a vacuum that applies a vacuum force, wherein the top plate moves in relation to the test probes a distance sufficient for the test probes to contact the extension card and the small electronic assembly in response to the vacuum force evacuating an area under the top plate and within the vacuum box.

19. The system of claim 18, further comprising an electronic testing assembly that applies an electronic test to the small electronic assembly in response to one or more test probes contacting the small electronic assembly.

20. The system of claim 18, further comprising one or more top test probes connected to the vacuum box that contact the small electronic circuit in response to the vacuum box moving toward the top plate.

* * * * *